(12) United States Patent
Song et al.

(10) Patent No.: US 7,008,804 B2
(45) Date of Patent: Mar. 7, 2006

(54) METHODS FOR COMPENSATING FOR A TEST TEMPERATURE DEVIATION

(75) Inventors: Jae Myeong Song, Kyonggi-do (KR); Chul Ho Ham, Kyonggi-do (KR); Chan Ho Park, Chungchongnam-do (KR); Byeng Gi Lee, Kyonggi-do (KR)

(73) Assignee: Mirae Corporation, Shungchongnam-do (KR)

( * ) Notice: Subject to any disclaimer, the term of this patent is extended or adjusted under 35 U.S.C. 154(b) by 61 days.

(21) Appl. No.: 10/366,576

(22) Filed: Feb. 14, 2003

(65) Prior Publication Data

US 2004/0019452 A1    Jan. 29, 2004

(30) Foreign Application Priority Data

Jul. 24, 2002  (KR)  .................. 10-2002-0043677

(51) Int. Cl.
*H01L 21/66* (2006.01)
*H05K 7/20* (2006.01)
*G01R 31/02* (2006.01)

(52) U.S. Cl. .................. 438/14; 361/690; 324/760

(58) Field of Classification Search ............... 361/676, 361/677, 678, 688, 689, 690; 438/14, 15, 438/122, 540; 324/754, 760
See application file for complete search history.

(56) References Cited

U.S. PATENT DOCUMENTS

| | | | |
|---|---|---|---|
| 5,943,211 A * | 8/1999 | Havey et al. | ............... 361/699 |
| 5,992,159 A * | 11/1999 | Edwards et al. | ................ 62/64 |
| 6,091,062 A | 7/2000 | Pfahnl et al. | ................ 219/497 |
| 6,108,201 A * | 8/2000 | Tilton et al. | ................ 361/689 |
| 6,552,561 B1 * | 4/2003 | Olsen et al. | ................ 324/760 |
| 2002/0109518 A1 * | 8/2002 | Saito et al. | ................ 324/760 |
| 2002/0113142 A1 * | 8/2002 | Patel et al. | ................ 239/128 |

FOREIGN PATENT DOCUMENTS

TW          414991          12/2000

\* cited by examiner

*Primary Examiner*—Carl Whithead, Jr.
*Assistant Examiner*—Jennifer M Dolan
(74) *Attorney, Agent, or Firm*—Fleshner & Kim, LLP

(57) ABSTRACT

Methods for compensating for a test temperature deviation in a semiconductor device handler are provided, in which a test temperature deviation of a semiconductor device caused by heat produced by the semiconductor device itself during testing of the semiconductor device at a preset temperature is compensated for. This allows a test of the semiconductor device to be carried out at an exact temperature. The method includes fitting at least one semiconductor device to at least one test socket and starting a test, measuring in real time a temperature of the semiconductor device using a temperature sensor, detecting a measured temperature change rate and comparing the measured temperature change rate to a preset value, spraying cooling fluid onto the semiconductor device by controlling a cooling fluid supplying apparatus if the measured value change rate is higher than a preset value, and stopping spray of the cooling fluid onto the semiconductor device by controlling the cooling fluid supplying apparatus if the measured value change rate is below the preset value, thereby optimizing a test environment and improving yield.

20 Claims, 6 Drawing Sheets

METHODS FOR COMPENSATING FOR A TEST TEMPERATURE DEVIATION

BACKGROUND OF THE INVENTION

1. Field of the Invention

The invention relates to methods for compensating for a test temperature deviation in a semiconductor device handler.

2. Background of the Related Art

In general, memory, or non-memory semiconductor devices, or modules having memory, and/or non-memory semiconductor devices arranged on a substrate to form a circuit, are subjected to various tests after fabrication before shipment. The semiconductor device handler (hereafter referred to as "handler") is an apparatus for automatic transportation of the semiconductor devices or modules during testing. The handler carries out a process in which, when a loading stacker receives trays having the semiconductor devices or modules held therein, a picker robot transports the semiconductor devices or modules to be tested to a test site, fits them into test sockets, carries out required tests, transports the tested semiconductor devices or modules to an unloading stacker, and unloads the semiconductor devices or modules on designated trays according to a result of the test, in order to classify the semiconductor devices or modules.

In general, many handlers have a system for carrying out, not only general performance tests at a room temperature, but also tests at extreme high or low temperatures to determine if the semiconductor devices or modules can carry out regular performance under the extreme temperature condition. An extreme high or low temperature environment is formed by providing an electric heater, or a liquefied gas spray system, within an enclosed chamber.

However, in carrying out a temperature test of the semiconductor device using a handler, the semiconductor device itself generates heat during the time the semiconductor device electrically connected to the test socket is tested. This added heat prevents conducting of a test at an exact preset temperature. This is a problem that must be solved for both test and actual application environments, as the semiconductor devices become smaller and packing density increases.

For example, in a high temperature test, if a user sets a temperature of an inside of the chamber to 80° C. for the test, if there is no heat generated by the semiconductor device itself, the test can be carried out at the set temperature of 80°. However, if heat is generated at the semiconductor d deviation of approx. 15° C. results and the test is carried out at 95° C., instead of at the desired temperature of 80° C.

Accordingly, the test of the semiconductor device is carried out at a temperature higher than the set temperature. This results in a drop in yield and reliability as the test at the desired temperature or within the desired temperature range failed.

SUMMARY OF THE INVENTION

An object of the invention is to solve at least the above problems and/or disadvantages and to provide at least the advantages described hereinafter.

Accordingly, the invention is directed to methods for compensating for a test temperature deviation in a handler that substantially obviate one or more of the problems due to limitations and disadvantages of the related art.

To achieve these and other advantages, in whole or in part, and in accordance with the purpose of the invention, as embodied and broadly described, a method is provided for compensating for a test temperature deviation in a semiconductor device handler having a cooling fluid supplying apparatus, a nozzle assembly configured to spray fluid supplied from the cooling fluid supplying apparatus onto at least one semiconductor device, respectively, fitted to at least one test socket, and a control unit configured to control the cooling fluid supplying apparatus, the method including fitting at least one semiconductor device to at least one socket and starting a test, measuring in real time a temperature change of the semiconductor device and comparing the measured temperature change to a preset value, spraying cooling fluid onto the semiconductor device if the measured temperature change is higher than a preset value as a result of the comparison, and stopping spray of the cooling fluid onto the semiconductor device if the measured temperature change is below the preset value as the result of the comparison.

To achieve these and other advantages, in whole or in part, and in accordance with the purpose of the invention, as embodied and broadly described, a method is further provided for compensating for a test temperature deviation in a semiconductor device handler having a cooling fluid supplying apparatus, a nozzle assembly configured to spray cooling fluid supplied from the cooling fluid supplying apparatus onto at least one semiconductor device, respectively, fitted to at least one test socket, and a control unit configured to control the cooling fluid supplying apparatus, the method including storing a table in the control unit, the table having cooling periods required for temperature change characteristics of different models of semiconductor devices, fitting at least one semiconductor device to at least one test socket and starting a test, and spraying cooling fluid onto the semiconductor device for the cooling period in the table for the respective semiconductor device on the test socket.

To achieve these and other advantages, in whole or in part, and in accordance with the purpose of the invention, as embodied and broadly described, a method is further provided for compensating for a test temperature deviation in a semiconductor device handler having a cooling fluid supplying apparatus, a nozzle assembly configured to spray cooling fluid supplied from the cooling fluid supplying apparatus onto at least one semiconductor device, respectively, fitted to at least one test socket, and a control unit configured to control the cooling fluid supplying apparatus, the method including fitting a first type of semiconductor device onto at least one test socket, detecting and storing time-temperature change characteristics of the first type of semiconductor device determined during an initial temperature test of the first type of semiconductor device, and controlling spraying of a cooling fluid onto the first type of semiconductor device according to the stored time-temperature change characteristics of the first type of semiconductor device during subsequent testing of the semiconductor device.

To achieve these and other advantages, in whole or in part, and in accordance with the purpose of the invention, as embodied and broadly described, a method is further provided for compensating for a test temperature deviation in a semiconductor device handler having a cooling fluid supplying apparatus, a nozzle assembly in communication with the cooling fluid supplying apparatus and configured to spray cooling fluid onto at least one semiconductor device, respectively, fitted to at least one test socket, and a control unit configured to control the cooling fluid supplying apparatus, the method comprising fitting at least one semiconductor device to at least one test socket and starting a test, and spraying a cooling fluid onto the semiconductor device based on temperature variations of the semiconductor device that occur during testing to compensate for heat generated by the semiconductor device during testing.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS

Figure 1:
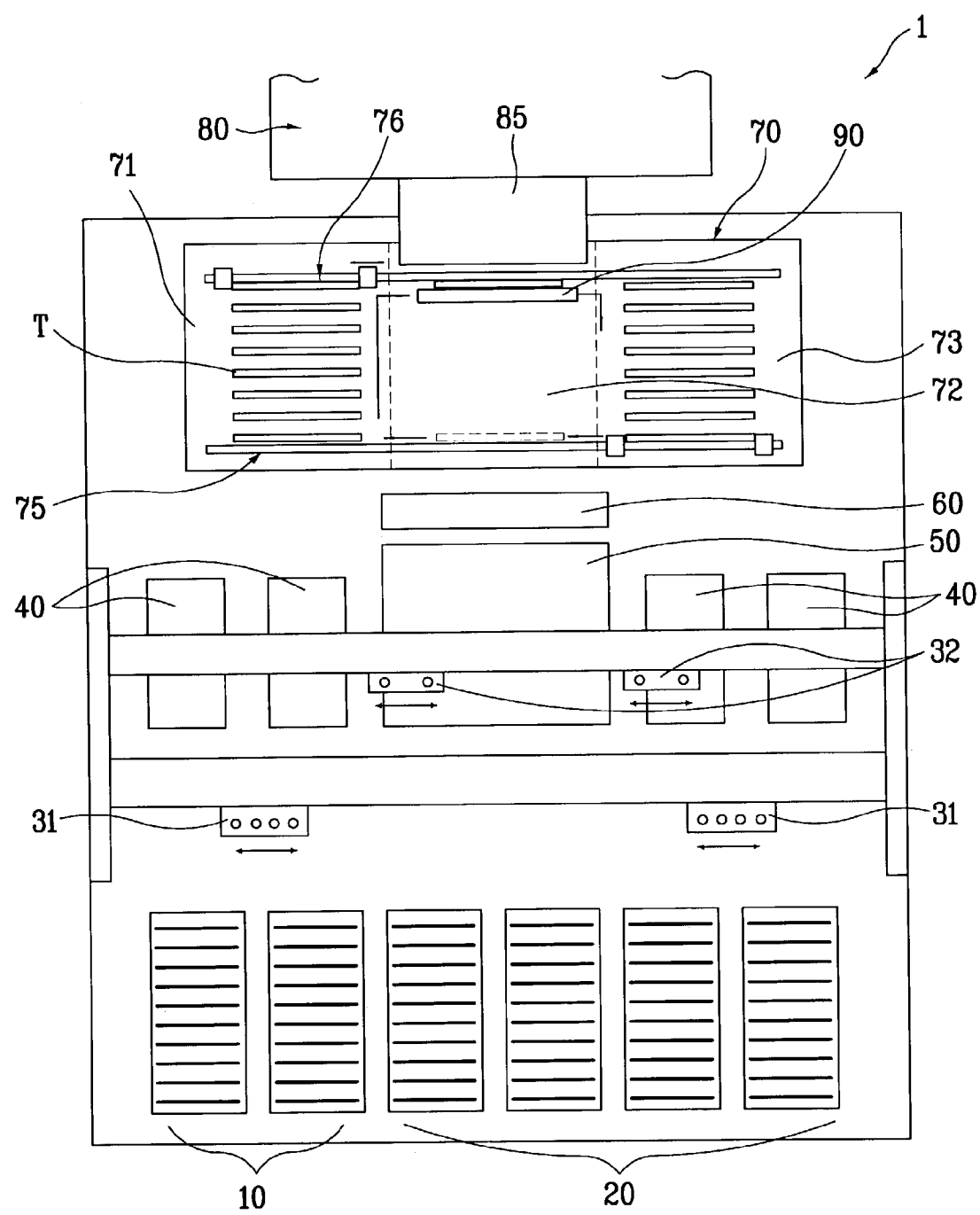
FIG. 1 is a schematic plan view of a handler according to an embodiment of the invention.
Figure 2A:
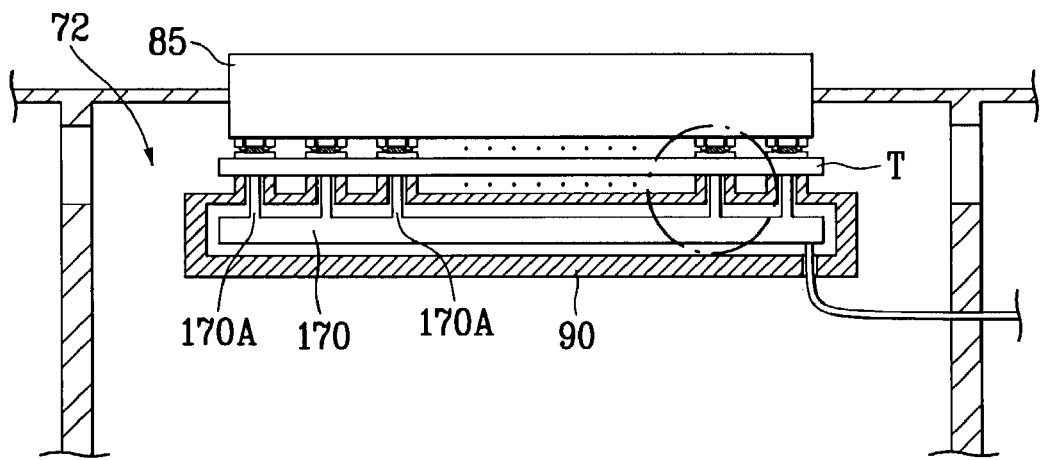
FIGS. 2(a) and 2(b) are schematic side sectional views of a test site of the handler of FIG. 1.
Figure 2B:
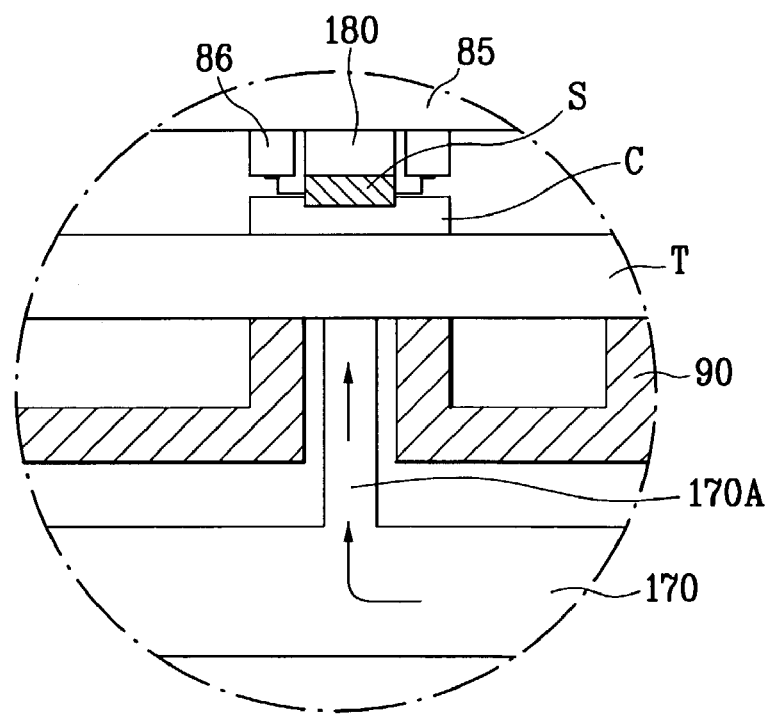

Reference will now be made in detail to embodiments of the invention, examples of which are illustrated in the accompanying drawings. FIGS. 1 and 2(a)–2(b) illustrate an example of a handler according to the invention having a device for compensating for a test temperature deviation. The system and operation of the handler will be explained as follows.

The handler 1 shown in FIG. 1 includes a loading unit 10 in a front portion of the handler 1 in which user trays may be loaded, and an unloading unit 20 to one side of the loading unit 10 in which tested semiconductor devices may be loaded on the user trays, with the tested semiconductor devices classified according to a result of the test(s).

Buffer units 40 are provided on both sides of a middle portion of the handler 1. The buffer units 40 temporarily retain the semiconductor devices transported from the loading unit 10. An exchange unit 50 is provided between the buffer units 40. The exchange unit 50 takes the semiconductor devices to be tested from the buffer units 40 and places them in a test tray T. The exchange unit 50 also returns the tested semiconductor devices from the test tray T to the buffer units 40.

One or more first picker robot(s) 31 and second picker robot(s) 32 are provided between the front portion of the handler 1 having the loading unit 10 and the unloading unit 20, and the middle portion of the handler 1 having the exchange unit 50 and the buffer units 40. Each picker unit 31, 32 is linearly movable in the X-Y axes directions and picks up the semiconductor devices. The first picker robot(s) 31 move(s) between the loading unit 10, the unloading unit 20, and the buffer units 40 to transport the semiconductor devices. The second picker robot(s) 32 move(s) between the buffer units 40 and the exchange unit 50 to transport the semiconductor devices.

A chamber unit 70 is provided in a rear portion of the handler 1 and includes a plurality of sealed chambers. One or more of the chambers may be fitted with an electric heater or a liquefied gas spraying system (not shown) to form a high or low temperature environment for testing semiconductor devices. The semiconductor device are placed within the respective chamber on the tray T and are then subjected to testing in the respective high or low temperature environment.

In the embodiment of FIG. 1, the chamber 70 includes a pre-heat chamber 71, a test chamber 72, and a defrosting chamber 73. In the pre-heat chamber 71, test trays T transported from the exchange unit 50 are heated or cooled to a preset temperature. In the test chamber 72, semiconductor device(s) positioned on the test trays T are fitted to test sockets 86 on a test board 85 (called a Hi-Fix) connected to an external test apparatus 80, and are then tested at the preset temperature. In the defrosting chamber 73, the tested semiconductor device(s) are restored to an initial room temperature. The pre-heat chamber 71 may heat or cool the test trays T to a preset temperature while moving the test trays T from a front portion thereof to a rear portion thereof. The defrost chamber 73 may restore the tested semiconductor devices to an initial room temperature while moving the test trays step by step from a rear portion thereof to a front portion thereof.

Figure 3:
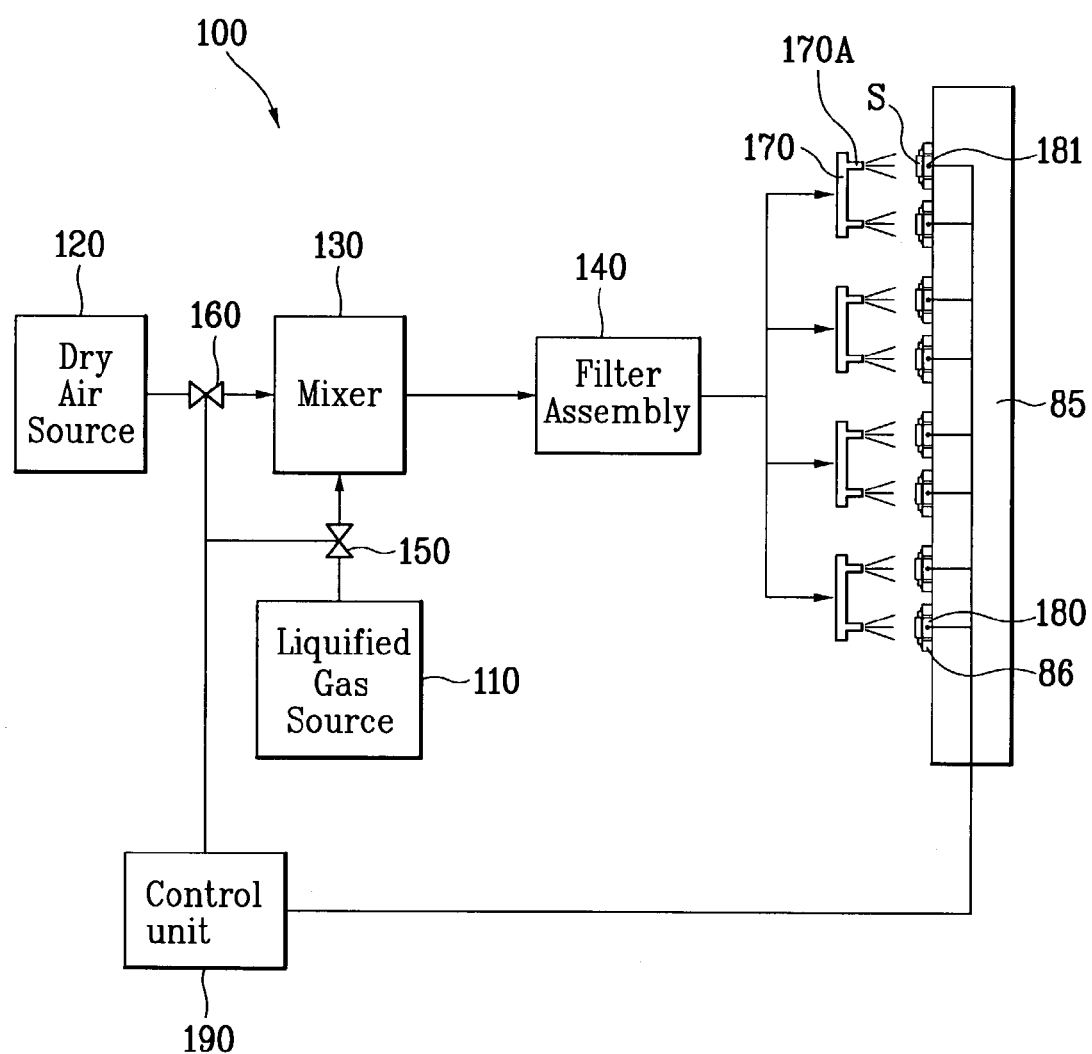
FIG. 3 is a schematic block diagram of a device for compensating for a test temperature deviation in accordance with an embodiment of the invention.

As shown in FIGS. 2A and 2B, pushing unit 90 is provided in the test chamber 72 for pushing the semiconductor device(s) attached to a carrier C on the test tray T toward the test board 85 for fitting/removing the semiconductor device(s) to/from the test socket 86. The pushing unit 90 includes a nozzle assembly 170 fixed thereto for spraying a cooling fluid mixture of dry air and liquefied gas. As shown in FIGS. 2A, 2B and 3, the nozzle assembly 170 includes a plurality of nozzles 170A which may be individually controlled. The cooling fluid mixture compensates for any temperature deviation by cooling down the semiconductor device(s) under test.

Moreover, heat sink(s) 180, such as an aluminum heat sinks, may be provided adjacent to the test sockets 86 of the test board 85. Alternatively, the heat sinks may be provided on the test tray T. The heat sink(s) 180 are brought into surface to surface contact with the semiconductor device(s) S to cool down the semiconductor device(s), thereby compensating for test temperature deviation together with the nozzle assembly 170.

The heat sink(s) 180 may have a built-in temperature sensor 181. The temperature sensor 181 detects and transmits a temperature to a control unit 190 (see FIG. 3). Alternatively, the temperature sensor may be provided on or in the carrier C, the test tray T, the pushing unit 90, or any other location in which it can sense a temperature, temperature change, and/or temperature change rate of a semiconductor device before, during, or after testing. The temperature sensor may also be provided on or as part of the test board 85. In one embodiment, the heat sink(s) 180 includes a heat pipe (not shown) filled with refrigerant for heat dissipation.

FIG. 3 is a schematic diagram of a device for compensating for a test temperature deviation in accordance with an embodiment of the invention. Referring to FIG. 3, the device 100 for compensating for a test temperature deviation includes a liquefied gas source 110 that supplies liquid gas, such as liquid nitrogen $LN_2$, a dry air source 120 that supplies dry air, a mixer connected both to the liquefied gas source 110 and the dry air source 120 that mixes the liquefied gas and the dry air uniformly producing a cooling fluid, and that supplies the cooling fluid to the nozzle assembly 170.

A first solenoid valve 150 is provided on a flow line connecting the liquid gas source 110 and the mixer 130. The first solenoid valve 150 controls a flow of the liquid gas supplied to the mixer 130. A second solenoid valve 160 is provided on a flow line connecting the dry air source 120 to the mixer 130. The second solenoid valve 160 controls a flow of dry air to the mixer 130. The first and second solenoid valves 150 and 160 are operated by the control unit 190 which electrically controls operation of the handler. The control unit 190 may control spraying of cooling fluid by controlling the spray rate of cooling fluid, a period of time that cooling fluid is sprayed, and/or the proportions of gases in the cooling fluid.

A filter assembly 140 is provided on a flow line connecting the mixer 130 and the nozzle assembly 170. The filter assembly 140 atomizes the liquid gas in order to prevent large grains of liquefied gas from spraying onto the semiconductor device through the nozzle assembly 170.

Methods for compensating for a test temperature deviation according to embodiments of the invention will be explained in detail below. For convenience, the methods are explained using the device discussed above, however, other devices may also be used to practice the methods according to the invention.

Methods for compensating for a test temperature deviation according to an embodiment of the invention may be conducted in a closed mode, an open mode, or a model reference mode, one or more of which may be selectively applicable. A worker selects one or more of the modes before testing based on the semiconductor devices to be tested.

The closed mode will be explained with reference to FIG. 4.

Upon proceeding to the closed mode according to a worker's selection and putting the handler into operation, an inside of the test chamber 72 is set to a preset temperature by a temperature control unit, such as an electric heater, or liquefied gas spraying system. For example, the control unit 190 controls the first solenoid valve 150 and the second solenoid valve 160 to supply liquefied gas and dry air to the mixer 130 from the liquefied gas source 110 and the dry air source 120, respectively. As previously stated, the control unit 190 may control spraying of cooling fluid by controlling the spray rate of cooling fluid, a period of time that cooling fluid is sprayed, and/or the proportions of gases in the cooling fluid. The mixer 130 mixes the liquefied gas and the dry air producing a cooling fluid. The cooling fluid is then passed through the filter assembly 140, and is sprayed onto the temperature sensor 181 in step S41.

If there is liquefied gas left in the flow passage, the liquefied gas is sprayed onto the semiconductor device. In the case where liquefied gas is sprayed, not in a gas state, but in a liquid state, the cooling down capability is reduced, failing to cool down the semiconductor device to a desired temperature within a short period of time. Therefore, before testing of the semiconductor device begins, it is determined whether the cooling fluid is in a gas or liquid state using a temperature change rate sensed at the temperature sensor 181 in step S42.

If the temperature change rate is below a preset value in step S42, it is determined that liquefied gas in a liquid state is contained in the spray, and the cooling fluid is then sprayed until the spray contains no liquefied gas. When the temperature change rate is higher than the preset value, it is determined that the spray contains no liquid. In that case, the control unit 190 stops the spray of the cooling fluid temporarily, and the handler moves the test tray moving the semiconductor devices(s) toward the test chamber 72 in step S43.

Then, as explained above, the test tray T having the semiconductor device(s) fitted thereto is transported into the test chamber 72, and placed between the pushing unit 90 and the test board 85. The pushing unit 90 then moves toward the test board 85 to fit the semiconductor device(s) S fitted to the carrier C of the test tray T to the test sockets 86, and carry out the test.

Next, the control unit 190 checks a temperature change of the semiconductor device(s) measured at the temperature sensor 181, and determines if the temperature change is higher than a preset value in step S44. If the temperature change of the semiconductor device(s) is higher than the preset value as a result of the determination in step S44, the control unit 190 sprays the cooling fluid onto the semiconductor device(s) through the nozzle assembly 170 in step S45.

After step S45, it is determined if the temperature change of the semiconductor device(s) drops below a preset value in step S46. The spray of the cooling fluid is stopped if the temperature change of the semiconductor device(s) drops below the preset value in step S47.

Thus, according to steps S44–S47, the control unit 190 maintains the temperature of the semiconductor device(s) at a desired level until the test is finished by checking in real time the temperature change of the semiconductor device(s), and spraying the cooling fluid.

Figure 5:
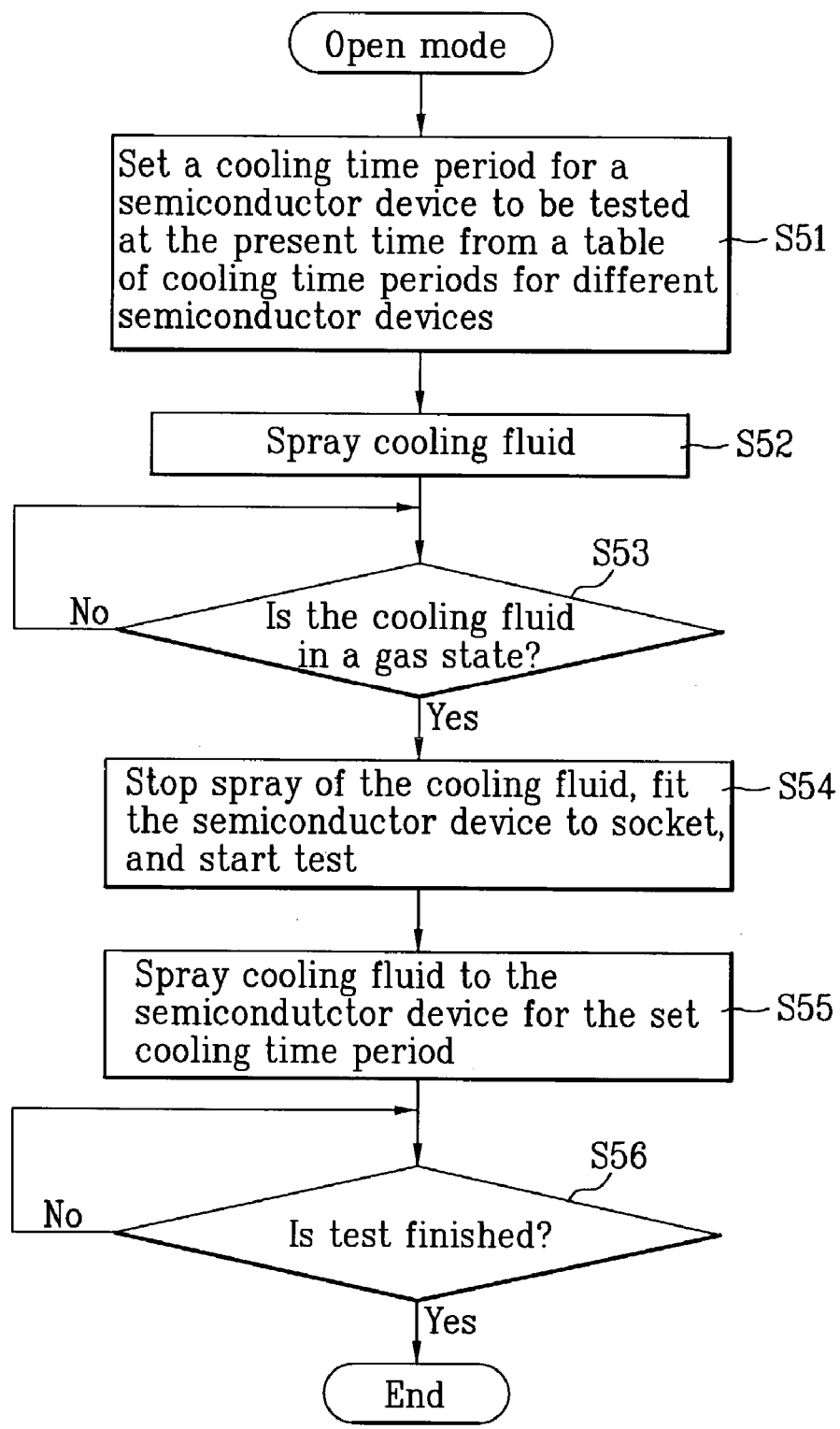
FIG. 5 is a flow chart of a method for compensating for a test temperature deviation in accordance with another embodiment of the invention.

Next, the open mode will be explained with reference to FIG. 5.

In order to carry out the test according to the open mode, a data table is stored in the system in advance. The table is obtained by carrying out test temperature deviation tests for different semiconductor devices, and storing in the data table cooling time periods required to eliminate the test temperature deviation for each of the respective different semiconductor devices.

When a worker selects the open mode and puts the handler into operation, the control unit 190 reads the stored data table, and sets a cooling time period for the particular semiconductor device to be tested at the present time, and proceeds with the test in step S51. Then, an inside of the test chamber 72 is bought to a required temperature state by a temperature control unit (not shown), such as an electric heater, or liquefied gas spray system, and the control unit 190 controls the first solenoid valve 150 and the second solenoid valve 160 to supply liquefied gas and dry air to the mixer 130 from the liquefied gas source 110 and the dry air source 120, respectively. The mixer 130 mixes the liquefied gas and the dry air producing a cooling fluid. The cooling fluid is then passed through the filter assembly 140, and is sprayed onto the temperature sensor 181 in step S52.

At this point, according to the same process as in the closed mode, it is determined whether a state of the cooling fluid is that of a gas state or liquid state using a temperature change rate sensed at the temperature sensor 181 in step S53.

If it is determined that liquefied gas is contained in the spray, the cooling fluid is sprayed until the spray contains no liquefied gas in order to prevent the direct spray of the liquefied gas onto the semiconductor device(s).

On the other hand, if it is determined that the spray contains no liquid, the control unit 190 stops the spray of the cooling fluid temporarily, the handler moves the test tray T to move the semiconductor device(s) toward the test chamber 72, and the semiconductor devices are fitted to the test socket in step S86 and tested in step S54.

While the semiconductor device test is carried out, the control unit 190 controls spraying of the cooling fluid onto the semiconductor device(s) for the preset cooling time period in step S55. As previously stated, the control unit 190 may control spraying of cooling fluid by controlling the spray rate of cooling fluid, a period of time that cooling fluid is sprayed, and/or the proportions of gases in the cooling fluid. After finishing the test in step S56, the process is ended.

Next, the model reference mode will be explained.

The model reference mode is a combination of the closed mode and the open mode. That is, while the closed mode is a method in which the spray of the cooling fluid is controlled by means of real time temperature checking and feed back, in order to maintain a fixed level of temperature for the semiconductor device(s), regardless of the temperature change characteristics of the semiconductor device, and the open mode is a method in which temperature change characteristics of the semiconductor device(s) are maintained as the cooling fluid is sprayed onto the semiconductor device(s) for a preset time period, the model reference mode is a method in which the spray of the cooling fluid is sprayed according to the temperature change characteristics of the type of semiconductor device(s) even if no real time temperature check and feed back is made.

Figure 4:
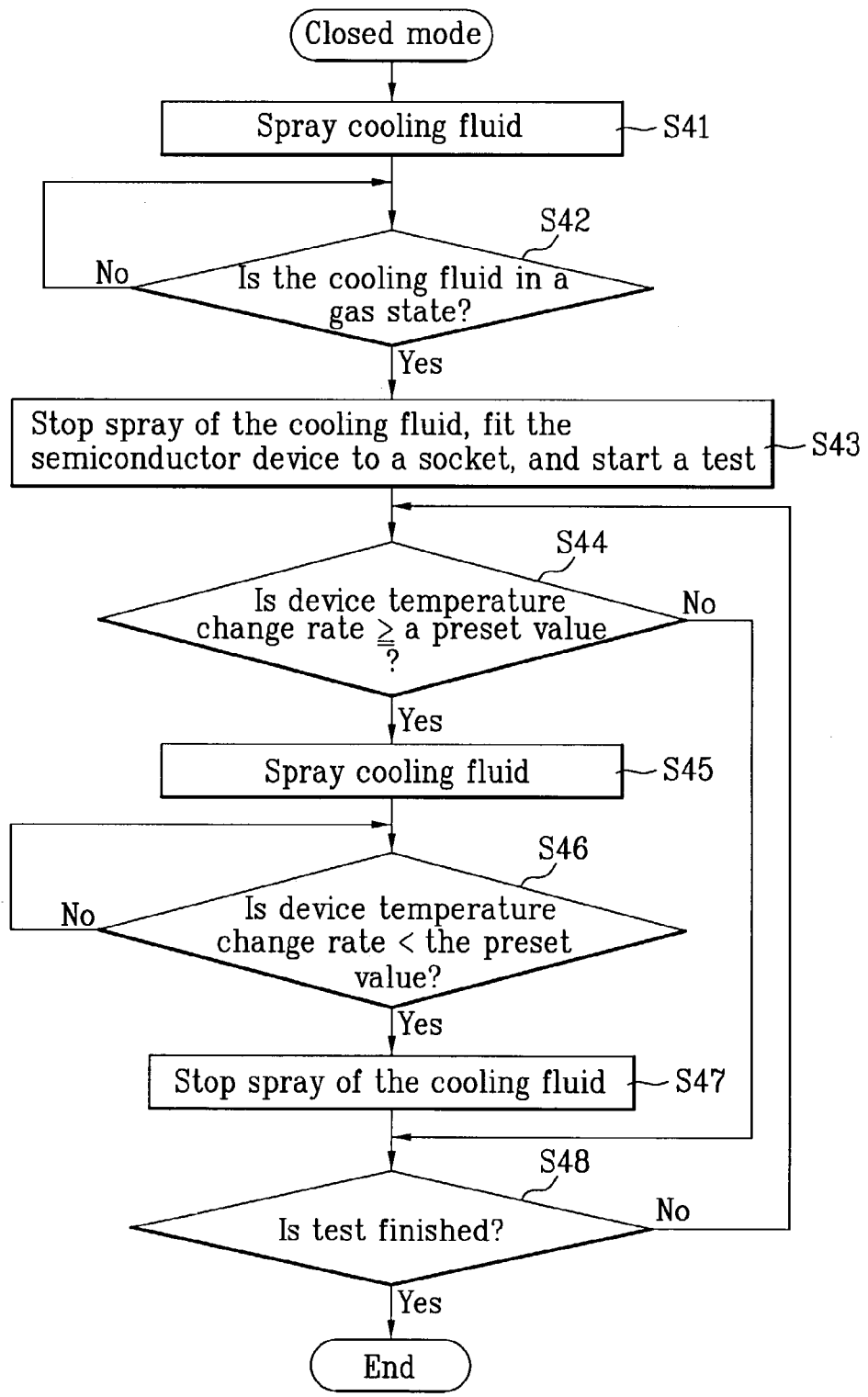
FIG. 4 is a flow chart of a method for compensating for a test temperature deviation in accordance with an embodiment of the invention.
Figure 6:
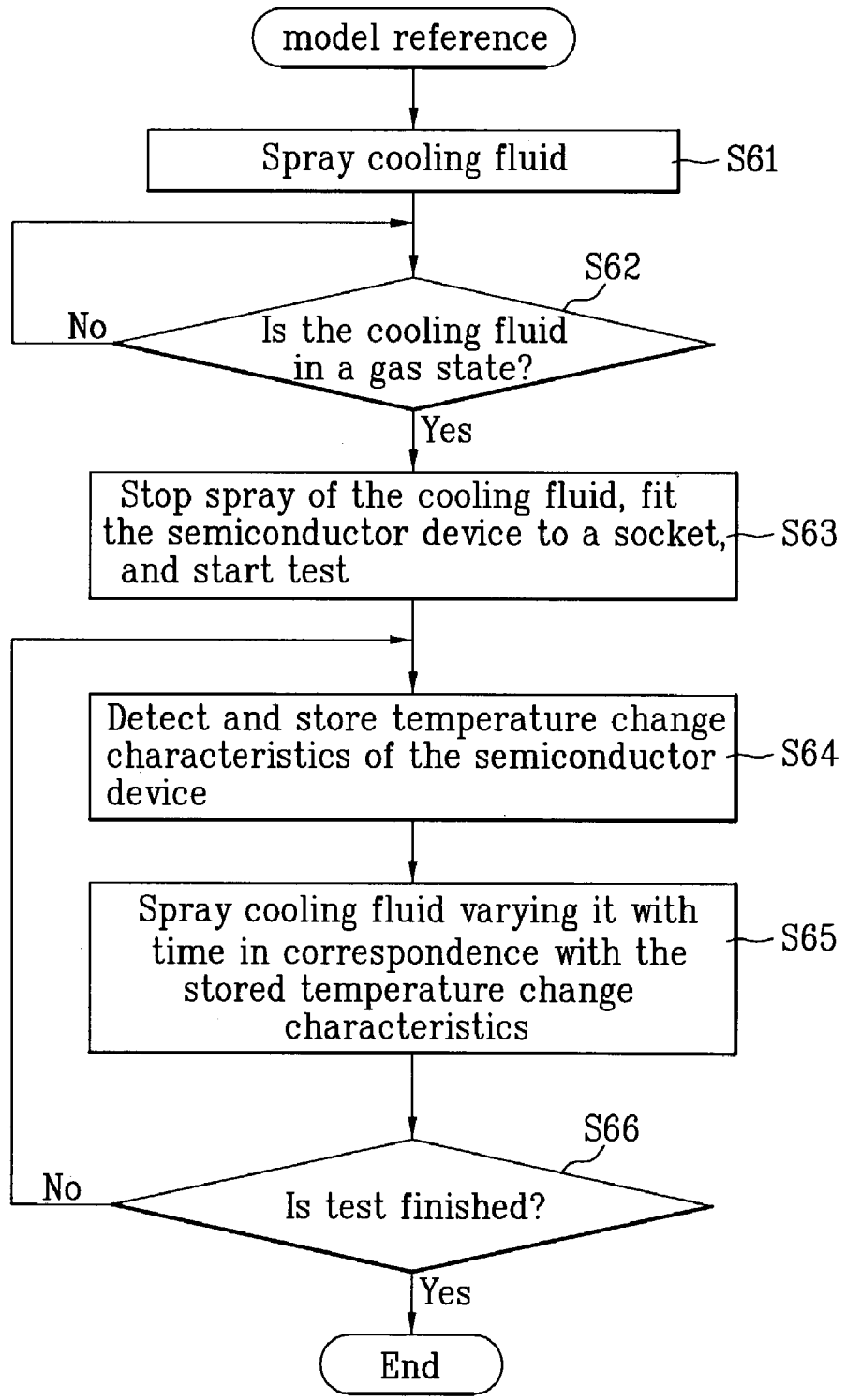
FIG. 6 is a flow chart of a method for compensating for a test temperature deviation in accordance with another embodiment of the invention.

In more detail, in the model reference mode, steps S61 and S62, as shown in FIG. 6, are similar to steps S41–S42 of FIG. 4. Next, the handler fits semiconductor device(s) positioned on a test tray to the test sockets 86, and carries out testing in step S63. At the same time, the control unit 190 detects and stores the temperature change characteristics of the type of semiconductor device(s) via the temperature sensor 181 in step S64.

Then, assuming that the temperature change characteristics of the initial stage of the test is a temperature change model for the semiconductor device(s), the control unit 190 controls spraying of the cooling fluid based on the temperature change characteristics stored in step S65, thereby maintaining a temperature of the semiconductor device(s) within an allowable range while maintaining the heat generation characteristics of the semiconductor device(s). As previously stated, the control unit 190 may control spraying of cooling fluid by controlling the spray rate of cooling fluid, a period of time that cooling fluid is sprayed, and/or the proportions of gases in the cooling fluid. After finishing the test in step S66, the process is ended.

The method is applicable to various kinds of semiconductor devices.

Further, as has been explained, the method for compensating for a test temperature deviation in a semiconductor device handler according to the invention has at least the following advantages.

First, the methods for compensating for a test temperature deviation in a handler allows tests to be conducted at an exact temperature range, or within an exact temperature range.

Second, a test environment can be optimized, and a test yield can be improved. Because cooling fluid is sprayed directly onto the semiconductor device, a temperature change rate maybe be checked in real time, and a desired temperature maintained.

Third, the availability of different modes (i.e. the closed mode, open mode, and the model reference mode), which may be used selectively or at the same time, can maximize a user's convenience.

The foregoing embodiments and advantages are merely exemplary and are not to be construed as limiting the invention. The present teaching can be readily applied to other types of apparatuses. The description of the invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for compensating for a test temperature deviation in a semiconductor device handler having a cooling fluid supplying apparatus, a nozzle assembly configured to spray cooling fluid supplied from the cooling fluid supplying apparatus onto at least one semiconductor device, respectively, fitted to at least one test socket, and a control unit configured to control the cooling fluid supplying apparatus, the method comprising:

fitting at least one semiconductor device to at least one test socket and starting a test;

measuring in real time a temperature change of the semiconductor device;

comparing the temperature change to a preset value;

spraying cooling fluid onto the semiconductor device if the measured change is higher than a preset value as a result of the comparison, wherein spraying the cooling fluid comprises controlling the cooling fluid supplying apparatus before fitting the semiconductor device to the test socket, and determining if the cooling fluid is in a gas state based on a measured temperature change rate before starting the test; and stopping spray of the cooling fluid onto the semiconductor device if the measured temperature change is below the preset value as the result of the comparison.

2. The method as claimed in claim 1, wherein measuring in real time a temperature change of the semiconductor device comprises using a temperature sensor positioned proximate the semiconductor device to measure a temperature change of the semiconductor device.

3. The method as claimed in claim 1, wherein the spraying of cooling fluid onto the semiconductor device is controlled based on a rate at which the cooling fluid is sprayed.

4. The method as claimed in claim 1, wherein the spraying of cooling fluid onto the semiconductor device is controlled based on a duration of time during which the cooling fluid is sprayed.

5. The method as claimed in claim 1, wherein the spraying of cooling fluid onto the semiconductor device is controlled based on a composition of the cooling fluid.

6. The method as claimed in claim 1, further comprising repeating the spraying and determining step until it is determined that the cooling fluid is in a gas state.

7. The method as claimed in claim 6, further comprising starting the test only if the cooling fluid is in a gas state.

8. A method for compensating for a test temperature deviation in a semiconductor device handler having a cooling fluid supplying apparatus, a nozzle assembly in communication with the cooling fluid supplying apparatus and configured to spray cooling fluid onto at least one semiconductor device, respectively, fitted to at least one test socket, and a control unit configured to control the cooling fluid supplying apparatus, the method comprising:

spraying cooling fluid and determining if the cooling fluid is in a gas state, and thereafter fitting at least one semiconductor device to at least one test socket and starting a test; and controlling spraying of cooling fluid onto the semiconductor device based on temperature variations of the semiconductor device measured during testing to compensate for heat generated by the semiconductor device during testing.

9. The method as claimed in claim 8, wherein the controlling step further comprises:

measuring a temperature change of the semiconductor device that occurs during testing using a temperature sensor and providing the measured temperature to the control unit;

comparing the measured temperature change to a preset value; and spraying the cooling fluid onto the semiconductor device only if the measured temperature change is higher than a preset value.

10. The method as claimed in claim 9, wherein the controlling step further comprises stopping spraying of the cooling fluid onto the semiconductor device if the measured temperature change is drops below the preset value.

11. The method as claimed in claim 8, wherein spraying cooling fluid and determining if the cooling fluid is in a gas state comprises determining if the cooling fluid is in a gas state based on a temperature change rate measured without a semiconductor device being present.

12. The method as claimed in claim 8, further comprising:

storing a table having cooling periods required for temperature change characteristics of different models of semiconductor devices, wherein the controlling step comprises spraying the cooling fluid for a cooling period selected from the table for the model of semiconductor device being tested.

13. The method as claimed in claim 12, wherein the table is created by testing different models of semiconductor devices to determine an appropriate cooling period required for temperature change characteristics of the different models of semiconductor devices.

14. The method as claimed in claim 8, further comprising:

detecting and storing temperature change characteristics for a first type of the semiconductor device that occurs during testing of the first type of semiconductor device using a temperature sensor and providing the measured temperature change characteristics to the control unit, wherein the controlling step comprises controlling spraying of the cooling fluid for subsequent testing of the first type of semiconductor device based on the stored temperature change characteristics.

15. The method as claimed in claim 14, wherein the controlling step further comprises controlling the spray rate.

16. The method as claimed in claim 14, wherein the controlling step further comprises a period of time that cooling fluid is sprayed.

17. The method as claimed in claim 14, wherein the controlling step further comprises proportions of gases in the cooling fluid.

18. The method as claimed in claim 8, wherein controlling spraying of a cooling fluid onto the semiconductor device comprises controlling a rate at which the cooling fluid is sprayed.

19. The method as claimed in claim 8, wherein controlling spraying of a cooling fluid onto the semiconductor device comprises controlling a duration of time which the cooling fluid is sprayed.

20. The method as claimed in claim 8, wherein controlling spraying of a cooling fluid onto the semiconductor device comprises controlling a composition of the cooling fluid.

* * * * *